United States Patent
Williams et al.

(10) Patent No.: US 6,946,920 B1
(45) Date of Patent: *Sep. 20, 2005

(54) CIRCUIT FOR LOCKING AN OSCILLATOR TO A DATA STREAM

(75) Inventors: Timothy J. Williams, Bellevue, WA (US); Jeffrey D. Wick, Snohomish, WA (US)

(73) Assignee: Cypress Semiconductor Corp., San Jose, CA (US)

( * ) Notice: Subject to any disclaimer, the term of this patent is extended or adjusted under 35 U.S.C. 154(b) by 23 days.

This patent is subject to a terminal disclaimer.

(21) Appl. No.: 10/339,115

(22) Filed: Jan. 9, 2003

Related U.S. Application Data

(63) Continuation of application No. 09/966,626, filed on Sep. 28, 2001, now Pat. No. 6,525,616, which is a continuation of application No. 09/511,020, filed on Feb. 23, 2000, now Pat. No. 6,297,705.

(51) Int. Cl.[7] .......................................... G01R 23/00
(52) U.S. Cl. ...................... 331/44; 331/34; 331/1 A; 331/17; 327/159; 327/166
(58) Field of Search ........................ 331/44, 1 A, 34, 331/17, 74; 327/159, 160, 166

(56) References Cited

U.S. PATENT DOCUMENTS

| | | | |
|---|---|---|---|
| 4,061,987 A | 12/1977 | Nagahama | 331/111 |
| 4,272,760 A | 6/1981 | Prazak et al. | 341/120 |
| 4,344,067 A | 8/1982 | Lee | 341/120 |
| 4,689,740 A | 8/1987 | Moelands et al. | 713/600 |
| 4,692,718 A | 9/1987 | Roza et al. | 331/113 R |
| 4,868,525 A | 9/1989 | Dias | 331/111 |
| 4,947,169 A | 8/1990 | Smith et al. | 341/121 |
| 5,140,197 A | 8/1992 | Grider | 327/142 |
| 5,150,079 A | 9/1992 | Williams et al. | 331/75 |
| 5,175,884 A | 12/1992 | Suarez | 455/260 |
| 5,200,751 A | 4/1993 | Smith | 341/147 |
| 5,304,955 A | 4/1994 | Atriss et al. | 331/1 R |
| 5,319,370 A | 6/1994 | Signore et al. | 341/120 |
| 5,428,319 A | 6/1995 | Marvin et al. | 331/176 |
| 5,440,305 A | 8/1995 | Signore et al. | 341/120 |
| 5,546,433 A | 8/1996 | Tran et al. | 375/376 |
| 5,552,748 A | 9/1996 | O'Shaughnessy | 331/1 A |
| 5,559,502 A | 9/1996 | Schutte | 340/825.21 |

(Continued)

FOREIGN PATENT DOCUMENTS

| | | | | |
|---|---|---|---|---|
| WO | WO 96/17305 | 6/1996 | | G06F 13/40 |
| WO | WO 98/34376 | 8/1998 | | H04L 12/20 |
| WO | WO 99/09712 | 2/1999 | | H04L 12/40 |

OTHER PUBLICATIONS

"Universal Serial Bus Specification", Revision 1.1, Sep. 23, 1998, pp. 1-311.

A 30-MHz Hybrid Analog/Digital Clock Recovery Circuit in 2-µm CMOS, By: Beomsup Kim et al., Journal of Solid-State Circuits, vol. 25, No. 6, Dec. 1990, pp. 1385-1394.

(Continued)

*Primary Examiner*—Arnold Kinkead
(74) *Attorney, Agent, or Firm*—Christopher P. Maiorana, PC

(57) ABSTRACT

An apparatus comprising a control circuit and a first circuit. The first circuit may be configured to generate a calibration signal in response to an adjustment signal and a first control signal. The control circuit may be configured to generate (i) the first control signal, (ii) a second control signal and (iii) the adjustment signal in response to a rate of an input signal.

20 Claims, 2 Drawing Sheets

U.S. PATENT DOCUMENTS

| | | | |
|---|---|---|---|
| 5,563,553 A | 10/1996 | Jackson | 331/57 |
| 5,565,819 A | 10/1996 | Cooper | 331/111 |
| 5,583,501 A | 12/1996 | Henrion et al. | 341/118 |
| 5,594,612 A | 1/1997 | Henrion | 341/120 |
| 5,604,466 A | 2/1997 | Dreps et al. | 331/113 R |
| 5,666,118 A | 9/1997 | Gersbach | 341/120 |
| 5,668,506 A | 9/1997 | Watanabe et al. | 331/66 |
| 5,670,915 A | 9/1997 | Cooper et al. | 331/111 |
| 5,682,049 A | 10/1997 | Nguyen | 257/363 |
| 5,686,863 A | 11/1997 | Whiteside | 330/260 |
| 5,689,196 A | 11/1997 | Schutte | 326/86 |
| 5,726,597 A | 3/1998 | Petty et al. | 327/307 |
| 5,796,312 A | 8/1998 | Hull et al. | 331/44 |
| 5,818,370 A | 10/1998 | Sooch et al. | 341/120 |
| 5,825,317 A | 10/1998 | Anderson et al. | 341/120 |
| 5,898,345 A | 4/1999 | Namura et al. | 331/177 V |
| 5,933,058 A | 8/1999 | Pinto et al. | 331/17 |
| 6,191,660 B1 | 2/2001 | Mar et al. | 331/111 |
| 6,407,641 B1 | 6/2002 | Williams et al. | 331/1 A |
| 6,525,616 B1 * | 2/2003 | Williams et al. | 331/44 |

OTHER PUBLICATIONS

WP 3.5: An Integrated Time Reference, By: Robert A. Blauschild, ISSCC94/Session 3, Analog Techniques/Paper WP 3.5, 1994.

Micropower CMOS Temperature Sensor with Digital Output, By: Anton Bakker et al., 1996 IEEE.

An Analog PLL-Based Clock and Data Recovery Circuit with High Input Jitter Tolerance, By: Sam Yinshang Sun, Reprinted from IEEE Journal of Solid-State Circuits, vol. SC-24, pp. 383-385, Apr. 1989.

CY7C63722/23 CY7C63742/43 enCoRe™ USB Combination Low-Speed USB & PS/2 Peripheral Controller, Cypress Semiconductor Corp., Feb. 2000- Revised Apr. 11, 2000, pp. 1-51.

Cy7C63221/31 enCoRe™ USB Low Speed USB Peripheral Controller, Cypress Semiconductor Corp., Feb. 2000- Revised Apr. 11, 2000, pp. 1-43.

* cited by examiner

CIRCUIT FOR LOCKING AN OSCILLATOR TO A DATA STREAM

This is a continuation of U.S. Ser. No. 09/966,626 filed Sep. 28, 2001 now U.S. Pat. No. 6,525,616, which is a continuation of U.S. Ser. No. 09/511,020 filed Feb. 23, 2000, now U.S. Pat. No. 6,297,705.

CROSS REFERENCE TO RELATED APPLICATION

The present application may relate to application Ser. No. 09/511,019, filed Feb. 23, 2000, now U.S. Pat. No. 6,407,641, which is hereby incorporated by reference in its entirety.

FIELD OF THE INVENTION

The present invention relates to a method and/or architecture for locking a data steam generally and, more particularly, to a method and/or architecture for locking an oscillator to a data stream.

BACKGROUND OF THE INVENTION

Conventional approaches for locking a data stream use Phase Lock Loops (PLL) and/or Delay Lock Loops (DLL) to lock or match a clock to an incoming data stream.

Such approaches typically require a very long training sequence and/or a continuous stream of data. Either requirement is incompatible with data communication systems like the Universal Serial Bus (USB), where the data packets can be short and bursty. For USB devices in particular, data may be present for only a very small percentage of the time, which could be less than 1%.

Delay Lock Loops and/or Phase Lock Loops can also suffer from the requirement of (i) long training sequences, (ii) requiring continuous input (e.g., cannot handle bursty data), and/or (iii) may need a precision timing component.

SUMMARY OF THE INVENTION

The present invention concerns an apparatus comprising a control circuit and a first circuit. The first circuit may be configured to generate a calibration signal in response to an adjustment signal and a first control signal. The control circuit may be configured to generate (i) the first control signal, (ii) a second control signal and (iii) the adjustment signal in response to a rate of an input signal.

The objects, features and advantages of the present invention include providing a method and/or architecture for locking an incoming data stream that may (i) precisely lock to a rate of the incoming data stream without an external precision timing element (e.g., without crystals, resonators, etc.), (ii) allow incoming data traffic to provide precision timing, (iii) provide multiple tuning phases during a single packet, and/or (iv) tune quickly (e.g., within one data packet).

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
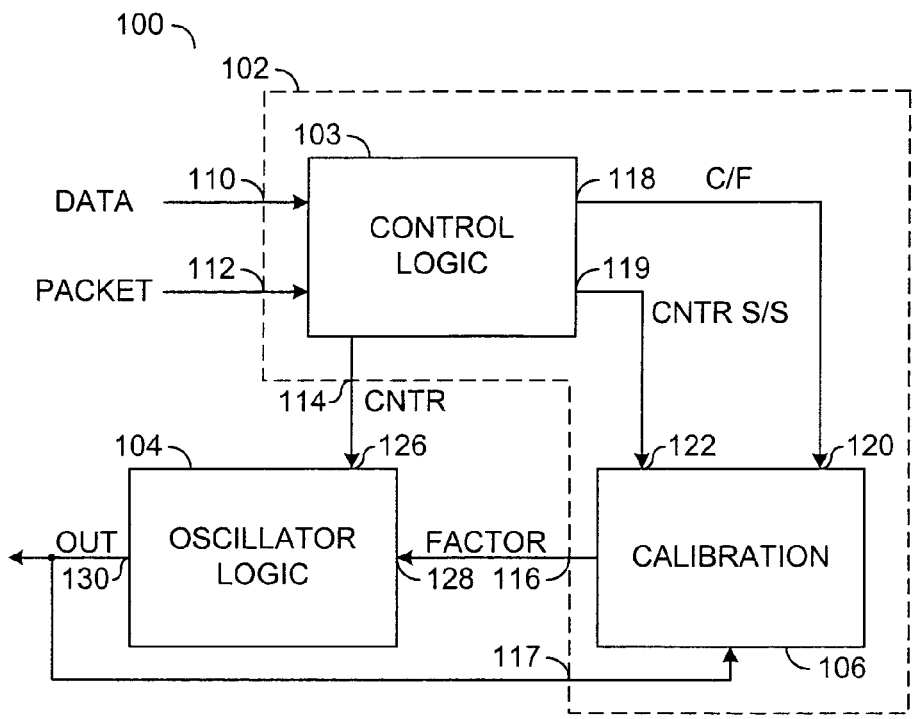
FIG. 1 is a block diagram of a preferred embodiment of the present invention.

Referring to FIG. 1, a block diagram of a circuit 100 is shown in accordance with a preferred embodiment of the present invention. The circuit 100 generally comprises a control circuit 102 and an oscillator logic block (or circuit) 104. The control circuit 102 may have an input 110 that may receive an incoming data stream (e.g., DATA), an input 112 that may receive a signal (e.g., PACKET), an output 114 that may present a control signal (e.g., CNTR), an output 116 that may present a control signal (e.g., FACTOR), and an input 117 that may receive a signal (e.g., OUT). The incoming data stream DATA may be a series of data packets that may not necessarily be continuous.

The control circuit 102 generally comprises a control logic block (or circuit) 103 and a counter block (or circuit) 106. The control logic block 103 may have an output 118 that may present an adjustment signal (e.g., C/F) and an output 119 that may present a control signal (e.g., CNTRS/S). The counter 106 may have an input 120 that may receive the signal C/F and an input 122 that may receive the signal CNTRS/S.

The oscillator logic circuit 104 may have an input 126 that may receive the signal CNTR, an input 128 that may receive the signal FACTOR and an output 130 that may present the signal OUT. In one example, the signal FACTOR may be implemented as a correction signal. However, the signal FACTOR may be implemented as any appropriate signal in order to meet the criteria of a particular implementation. The circuit 100 may perform measurements on the incoming data stream DATA that may produce the correction (or adjustment) signal FACTOR. The signal FACTOR may alter the frequency of oscillation of the signal OUT to match a multiple of a rate of the incoming data stream DATA. The circuit 100 may be a building block in a system (or chip) designed to automatically modify and lock the frequency of oscillation of the signal OUT to a multiple of the rate of the incoming data signal DATA. An example of such an implementation may be found in applications such as the Universal Serial Bus (USB) (e.g., the Universal Serial Bus Specification 1.1, published Sep. 23, 1998, which is hereby incorporated by reference in its entirety).

The circuit 100 may tune the oscillator logic 104 to match a multiple of the data rate of the incoming signal DATA. The circuit 100 may be implemented without precision timing elements.

Figure 2:
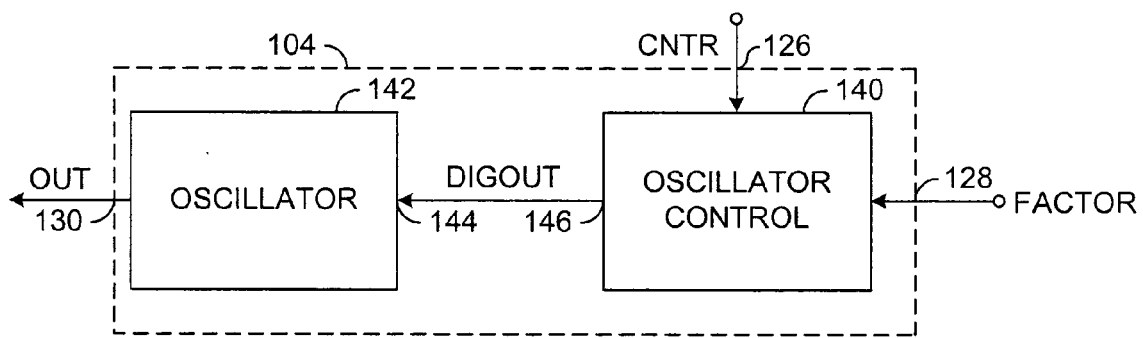
FIG. 2 is a more detailed diagram of the oscillator logic circuit of FIG. 1.

Referring to FIG. 2, a more detailed diagram of the oscillator logic circuit 104 is shown. The oscillator logic circuit 104 generally comprises an oscillator control block (or circuit) 140 and an oscillator circuit 142. In one example, the oscillator 142 may be implemented as a digitally controlled oscillator (DCO). In another example, the oscillator 142 may be implemented as a programmable oscillator. However, various oscillators may be implemented accordingly to meet the design criteria of a particular implementation. The oscillator 142 generally receives a signal (e.g., DIGOUT) at an input 144. The signal DIGOUT may control the frequency of oscillation of the signal OUT. The signal DIGOUT may be implemented as a multi-bit digital word. The oscillator control circuit 140 may have an output 146 that may present the signal DIGOUT in response to the signals CNTR and FACTOR. The signal CNTR may determine when adjustments should be made in the frequency of oscillation of the signal OUT. The signal FACTOR may provide a value that may control coarse and/or a fine tuning of the signal DIGOUT.

Figure 3:
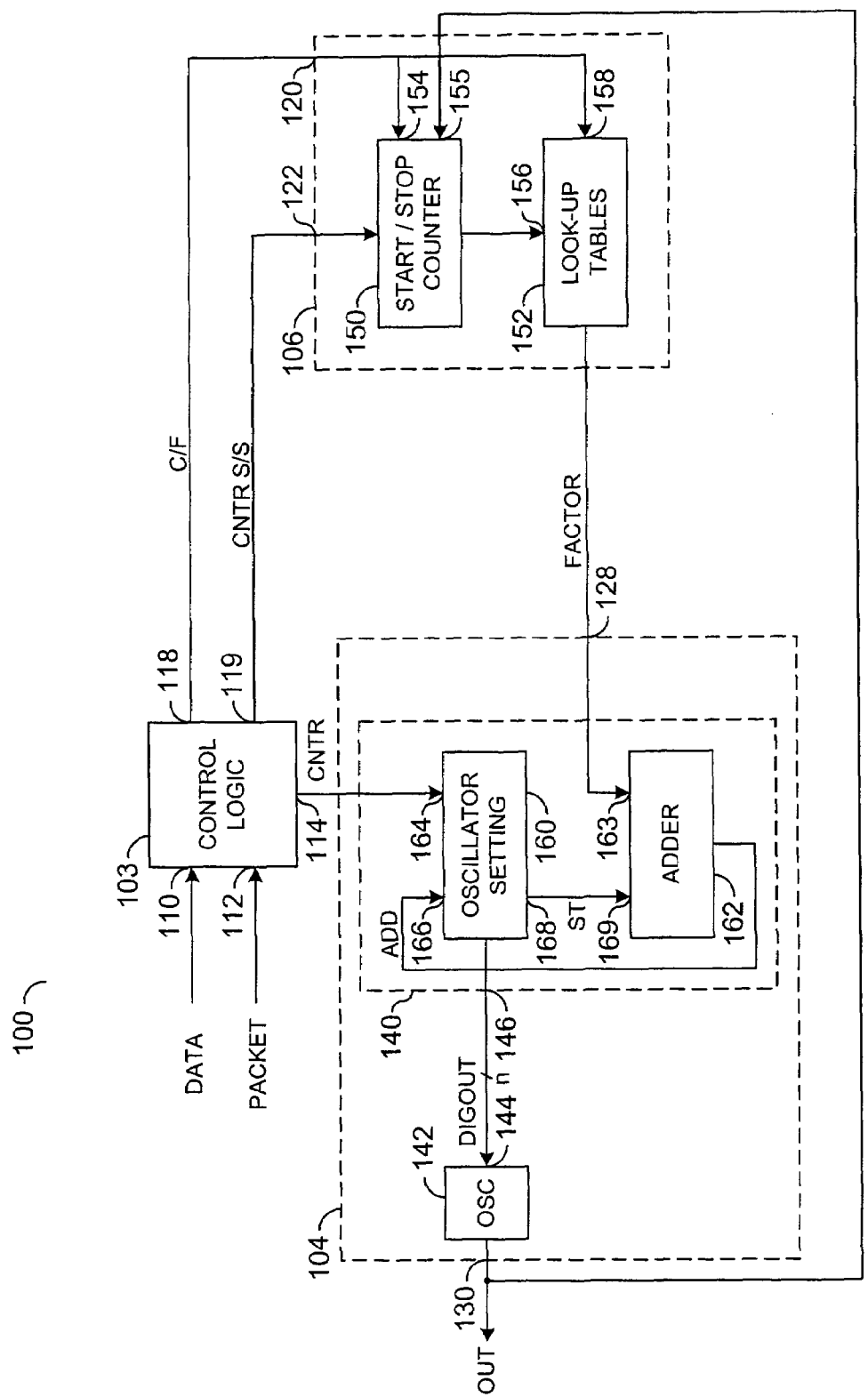
FIG. 3 is a detailed block diagram of the circuit of FIG. 1.

Referring to FIG. 3, a more detailed diagram of the circuit 100 is shown. The counter circuit 106 generally comprises a calibration block (or circuit) 150 and a look-up table 152. In one example, the calibration block 150 may comprise an n-bit counter, where n is an integer. However, the calibration block 150 may be implemented as other appropriate counters or circuits necessary to meet the criteria of a particular implementation. The calibration circuit 150 may have a start/stop input 122 that generally receives the signal CNTRS/S and an input 155 that may receive a feedback of the signal OUT. The calibration circuit 150 may also have an input 154 that may receive the signal C/F. The look-up table 152 may have an input 156 that may receive a signal from the counter block 150 and an input 158 that may receive the signal C/F.

The oscillator control block 140 generally comprises an oscillator setting block 160 and an adder block 162. The adder block 162 may have an input 163 that may receive the signal FACTOR. The oscillator setting block 160 may have an input 164 that may receive the signal CNTR, an input 166 that may receive a signal (e.g., ADD) and an output 168 that may present a signal (e.g., ST) to an input 169 of the adder 162. The adder 162 may present the signal ADD in response to the signal FACTOR and the signal ST.

Certain data communication systems require a precise local clock for accurate transmission (e.g., 1.5% accuracy in USB applications) and proper reception of incoming data. The circuit 100 may be implemented with a look-up table (as compared with conventional circuits that use a PLL). The look-up table 152 generally stores a fixed table of known characters that may determine how to adjust the frequency of oscillation of the signal OUT. The signal FACTOR may be an offset value that may control an adjustment in the frequency of oscillation of the signal OUT.

The circuit 100 may be used for generating the oscillator update signal DIGOUT by using the counter circuit 150 to calibrate the rate of oscillation of the signal OUT in response to the data rate of the incoming data stream DATA. Packet information (in the example of USB applications) may be used to distinguish appropriate data packets and/or key transitions. The look-up table 152 may hold correction terms based on interval counts and may generate the signal FACTOR that may be used to tune the frequency of oscillation of the signal OUT. The circuit 100 may be used to determine and adjust the frequency of oscillation of the signal OUT to be fixed to a multiple of the data rate of the signal DATA. The circuit 100 may be used to recover data without the conventional requirement of a crystal based oscillator or other external precision timing element.

Edges in the signal DATA may be recognized by the control circuit 102 to start and end various events. For example, during the early part of a data packet of the signal DATA, a coarse tuning may be performed by the signal C/F. The coarse tuning may involve running the counter 150 for a pre-determined number of data edges (e.g., in the case of USB, this may be implemented to take place during the synchronizing phase where edges occur every bit time). After the target number of data bit times have passed, the counter circuit 150 is generally stopped.

If the clock signal OUT matches (e.g., is a multiple of) the rate of the signal DATA, the count will equal the oversampling rate of the signal OUT times the number of bit-times in the measurement. If the signal OUT is at the ideal value, the counter 150 will end at the target value, plus or minus an error due to such factors as jitter or phase error in the incoming data stream DATA, which may give an inherent ±1 count uncertainty.

The output of the counter 150 may be fed directly to the look-up table 152 to find a correction factor for the particular rate of oscillation of the signal OUT. The value of the signal FACTOR may then be added to the present setting to produce a coarsely corrected frequency of oscillation. The new setting may be applied to the oscillator 142 to generate the updated frequency of the signal OUT. The new setting may remain until a subsequent adjustment is made, if such a subsequent adjustment is made.

Such a process may be repeated over a longer portion of the packet in order to achieve greater resolution in the correction term. The control logic block 103 may use known edges in the incoming data signal DATA to start and stop the counter block 150 another time, in one example, over a longer time period. The output of the counter 150 may then be directed to a fine-tune portion of lookup tables 152. The value may then be added (or subtracted) from the oscillator frequency setting via the signal DIGOUT to produce the final frequency of oscillation of the signal OUT.

The control block 102 may also receive inputs from other circuitry that may provide useful information about the incoming data packets (e.g. whether a particular packet is erroneous or not, what portion of a particular packet is presently arriving, etc.) In one example, such information could be built into the control block 103. In the case of USB, the USB Serial Interface Engine (SIE), already present for USB processing, may be used to supply information to the control block 103.

Error checking may be performed during the coarse and or fine tuning to avoid false tuning on noisy signals. Tuning may be limited (e.g., by information from the SIE) to certain appropriate types of data packets. For example, in USB, the appropriate data packets may be limited to token packets addressed to the device. In one example, the coarse tuning may occur on various packets. However, the fine tuning may be implemented, in one example, to occur during a token packet addressed to the device.

The circuit 100 may be tuned quickly (e.g., within one data packet). The circuit 100 may enable circuits that receive the signal OUT to run without precision timing elements (e.g., without crystals, resonators, etc.). Various options may be implemented for the tuning phases of the circuit 100. For example, in place of the coarse/fine tuning described, the circuit 100 may be implemented with only one tuning phase with an increased accuracy. Alternatively, more than two tuning phases may be implemented to meet the design criteria of a particular implementation.

Additionally, in another example, some type of averaging may be implemented across several packets to reduce the number (or size) of particular frequency adjustments.

The present invention may provide a key block that may be used in connection with the oscillator logic block 104. The present invention may provide a system cost saving by eliminating precision timing components (e.g., crystal, resonator, etc.) in data communications systems. While particular aspects of the present invention have been described in the context of USB applications, other applications may also be implemented. The circuit 100 may be used to achieve demanding cost targets, such as designing low-cost mouse controllers.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a circuit configured to generate a calibration signal and a first control signal in response to an input signal, wherein said calibration signal remains at a setting when said input signal is not continuous.

2. The apparatus according to claim 1, further comprising:
   an oscillator circuit configured to generate a clock signal in response to said first control signal and said calibration signal.

3. The apparatus according to claim 1, wherein said circuit comprises:
   one or more counters configured to generate an output in response to an adjustment signal and a second control signal.

4. The apparatus according to claim 1, wherein said circuit further comprises a look-up table configured to generate said calibration signal.

5. The apparatus according to claim 2, wherein said oscillator circuit comprises:
   an oscillator control circuit configured to generate a multi-bit digital word; and
   an oscillator configured to generate said clock signal in response to said multi-bit digital word.

6. The apparatus according to claim 5, wherein said oscillator comprises a programmable oscillator.

7. The apparatus according to claim 5, wherein said multi-bit digital word is generated in response to said first control signal and said calibration signal.

8. The apparatus according to claim 5, wherein said oscillator control circuit comprises an oscillator setting block and an adder circuit.

9. The apparatus according to claim 3, wherein said adjustment signal comprises a coarse/fine adjustment signal.

10. The apparatus according to claim 3, wherein said second control signal is configured to start and stop said one or more counters.

11. An apparatus comprising:
    a circuit configured to generate a calibration signal in response to values stored in a lookup table wherein said lookup table is accessed in response to a rate of an input signal.

12. The apparatus according to claim 11, further comprising:
    an oscillator circuit configured to generate a clock signal in response to a first control signal and said calibration signal, wherein said first control signal is generated in response to said input signal.

13. A method for locking a clock signal to a rate of a data stream comprising the steps of:
    (A) generating said clock signal in response to a first control signal and a calibration signal; and
    (B) generating said calibration signal and said first control signal in response to said data stream, wherein said calibration signal remains at a setting when said data stream is not continuous.

14. The method according to claim 13, wherein step (B) further comprises the steps of:
    generating said calibration signal in response to an adjustment signal and a second control signal; and
    generating (i) said first control signal, (ii) said second control signal and (iii) said adjustment signal in response to said data stream.

15. The method according to claim 13, wherein step (A) further comprises the sub-steps of:
    generating a multi-bit digital word; and
    generating said clock signal in response to said multi-bit digital word.

16. The method according to claim 15, wherein said multi-bit digital word is generated in response to said first control signal and said calibration signal.

17. The method according to claim 14, wherein said adjustment signal comprises a coarse/fine adjustment signal.

18. The method according to claim 14, wherein step (B) further comprises starting and stopping an adjustment of said calibration signal in response to said second control signal.

19. The apparatus according to claim 1, wherein said calibration signal is configured to control an oscillator in a Universal Serial Bus device.

20. The apparatus according to claim 12, wherein said oscillator circuit is configured to control a Universal Serial Bus device.

* * * * *